(12) United States Patent
Zhidkov et al.

(10) Patent No.: US 8,850,294 B1
(45) Date of Patent: Sep. 30, 2014

(54) DECODING APPARATUS FOR DIGITAL COMMUNICATIONS AND METHOD FOR USING THE SAME

(75) Inventors: Sergey Zhidkov, Suwon-si (KR);
Do-jun Rhee, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 1796 days.

(21) Appl. No.: 11/733,003

(22) Filed: Apr. 9, 2007

(51) Int. Cl.
*H03M 13/00* (2006.01)
*H03M 13/03* (2006.01)

(52) U.S. Cl.
USPC ............ 714/780; 714/755; 714/794; 714/795

(58) Field of Classification Search
USPC .................................. 714/755, 780, 794, 795
See application file for complete search history.

(56) References Cited

U.S. PATENT DOCUMENTS

| | | | | |
|---|---|---|---|---|
| 6,029,264 | A * | 2/2000 | Kobayashi et al. ............ | 714/755 |
| 6,212,659 | B1 * | 4/2001 | Zehavi ........................... | 714/755 |
| 6,351,832 | B1 * | 2/2002 | Wei ................................ | 714/701 |
| 6,356,595 | B1 * | 3/2002 | Czaja et al. .................... | 375/262 |
| 6,484,283 | B2 * | 11/2002 | Stephen et al. ................ | 714/786 |
| 6,553,538 | B2 * | 4/2003 | Zehavi ........................... | 714/784 |
| 6,606,724 | B1 * | 8/2003 | Krieger et al. ................ | 714/755 |
| 6,732,327 | B1 | 5/2004 | Heinila | |
| 6,789,593 | B1 | 9/2004 | Aono et al. | |
| 6,810,502 | B2 * | 10/2004 | Eidson et al. ................. | 714/786 |
| 6,963,618 | B2 * | 11/2005 | Citta et al. .................... | 375/262 |
| 7,035,342 | B2 * | 4/2006 | Cameron et al. .............. | 375/265 |
| 7,093,179 | B2 * | 8/2006 | Shea .............................. | 714/755 |
| 7,158,589 | B2 * | 1/2007 | Cameron et al. .............. | 375/341 |
| 7,310,768 | B2 * | 12/2007 | Eidson et al. ................. | 714/786 |
| 7,409,006 | B2 * | 8/2008 | Cameron et al. .............. | 375/295 |
| 7,415,079 | B2 * | 8/2008 | Cameron et al. .............. | 375/340 |
| 7,421,044 | B2 * | 9/2008 | Cameron et al. .............. | 375/340 |
| 7,440,521 | B2 * | 10/2008 | Tran et al. ..................... | 375/341 |
| 7,460,608 | B2 * | 12/2008 | Cameron et al. .............. | 375/265 |
| 7,499,503 | B2 * | 3/2009 | Cameron et al. .............. | 375/298 |
| 7,519,898 | B2 * | 4/2009 | Narayanan et al. ........... | 714/801 |
| 7,551,236 | B2 * | 6/2009 | Choi et al. .................... | 348/725 |
| 7,568,147 | B2 * | 7/2009 | Eidson et al. ................. | 714/786 |
| 7,577,893 | B2 * | 8/2009 | Song et al. .................... | 714/755 |
| 7,587,657 | B2 * | 9/2009 | Haratsch ....................... | 714/780 |
| 7,715,503 | B2 * | 5/2010 | Cameron et al. .............. | 375/340 |
| 7,796,712 | B2 * | 9/2010 | Choi et al. .................... | 375/341 |
| 7,814,398 | B2 * | 10/2010 | Djurdjevic et al. ........... | 714/784 |
| 2002/0029362 | A1 * | 3/2002 | Stephen et al. ................ | 714/752 |

FOREIGN PATENT DOCUMENTS

JP 2004-254348 9/2004

OTHER PUBLICATIONS

English Abstract Publication No. 2004-254348.

* cited by examiner

*Primary Examiner* — Joseph D Torres
(74) *Attorney, Agent, or Firm* — F. Chau & Associates, LLC

(57) ABSTRACT

A decoding apparatus and method for estimating a reliability value by detecting uncorrected packet errors. The decoding apparatus includes a hard-decision unit and a reliability determination unit. The hard-decision unit performs hard-decision on a soft-input of a code. The reliability determination unit generates a reliability estimation value of the hard-decision result according to whether a packet error exists in the hard-decision result. The hard-decision unit performs hard-decision in response to the reliability estimation value.

21 Claims, 9 Drawing Sheets

DECODING APPARATUS FOR DIGITAL COMMUNICATIONS AND METHOD FOR USING THE SAME

BACKGROUND OF THE INVENTION

1. Field of the Invention

The present disclosure relates to a decoding apparatus, and more particularly, to a decoding apparatus for digital communications and a method for using the same.

2. Discussion of the Related Art

Concatenated codes are widely used for error correction of digital communication systems. The concatenated codes are based on outer Reed-Solomon codes and inner convolutional codes.

FIG. 1 is a block diagram of a conventional digital communication system 100 which uses concatenated Reed-Solomon codes and convolutional codes.

Referring to FIG. 1, a transmitting terminal of the conventional digital communication system 100 processes an input bit stream BS_IN, using a Reed-Solomon encoder 110, an interleaver 120, a convolutional encoder 130, and a modulator 140. The processed bit stream is transmitted through a channel 150. A receiving terminal of the conventional digital communication system 100 receives the transmitted bit stream and generates a decoding bit stream BSDEC using a demodulator 160 and a concatenated decoder 200.

FIG. 2 is a detailed block diagram of the concatenated decoder 200 illustrated in FIG. 1.

Referring to FIG. 2, the concatenated decoder 200 included in the conventional digital communication system 100 decodes a received bit stream using a Soft-Input Viterbi decoder 210, a deinterleaver 220, and a hard-decision Reed-Solomon decoder 230, and generates a decoding bit stream BS_DEC.

However, the concatenated decoder 200 included in the conventional digital communication system 100 cannot sufficiently use the error correction performance of concatenated Reed-Solomon codes and concatenated convolutional codes (hereinafter, referred to as concatenated RSC codes).

SUMMARY OF THE INVENTION

Exemplary embodiments of the present invention provide a decoding apparatus that estimates a reliability value by detecting uncorrected packet errors.

Exemplary embodiments of the present invention also provide a decoding method that estimates a reliability value by detecting uncorrected packet errors.

According to an aspect of the present disclosure, a decoding apparatus includes a hard-decision unit and a reliability determination unit. The hard-decision unit performs hard-decision on a soft-input of a code. The reliability determination unit generates a reliability estimation value of the hard-decision result, according to whether a packet error exists in the hard-decision result. The hard-decision unit performs the hard-decision in response to the reliability estimation value.

The hard-decision unit may include a hard-decision Reed-Solomon decoder for performing the hard-decision and outputting the hard-decision result to the reliability determination unit.

The reliability determination unit may include a packet error detector that detects the packet error, in response to the hard-decision result of the hard-decision Reed-Solomon decoder.

The reliability determination unit may further include a reliability estimation value generator that generates a reliability estimation value of the hard-decision result, according to whether the packet error is detected.

The reliability estimation value generator may generate a reliability estimation value which changes in response to the hard-decision result when no packet error is detected. The reliability estimation value generator may generate a constant reliability estimation value when the packet error is detected.

The reliability estimation value generator may also include a multiplexer that selects one of the hard-decision result values and a predetermined constant value in response to whether the packet error is detected.

The hard-decision unit may also include a soft-input/hard-output decoder that generates a hard-output in response to the soft-input of the code and the reliability estimation value. The hard-decision Reed-Solomon decoder performs hard-decision on the hard-output generated by the soft-input/hard-output decoder.

The soft-input/hard-output decoder may be a soft-input/hard-output Viterbi decoder or a soft-input/hard-output convolutional decoder.

According to another aspect of the present disclosure, a decoding method includes a hard-decision operation and a reliability determination operation. The hard-decision operation performs hard-decision on a soft-input of a code. The reliability determination operation generates a reliability estimation value of the hard-decision result according to whether a packet error exists in the hard-decision result. The hard-decision operation performs the hard-decision in response to the reliability estimation value.

The hard-decision operation may include a hard-decision Reed-Solomon decoding operation. The hard-decision Reed-Solomon decoding operation performs the hard-decision and outputs the hard-decision result to the reliability determination operation. The reliability determination operation may include a packet error detection operation. The packet error detection operation detects the packet error in response to the hard-decision result of the hard-decision Reed-Solomon decoding operation. The reliability determination operation may also include a reliability estimation value generating operation. The reliability estimation value generating operation generates a reliability estimation value of the hard-decision result according to whether the packet error is detected.

BRIEF DESCRIPTION OF THE DRAWINGS

The above and other features and aspects of the present disclosure will become more apparent by describing, in detail, exemplary embodiments of the present invention with reference to the attached drawings in which.

DETAILED DESCRIPTION OF THE EXEMPLARY EMBODIMENTS

Figure 1:
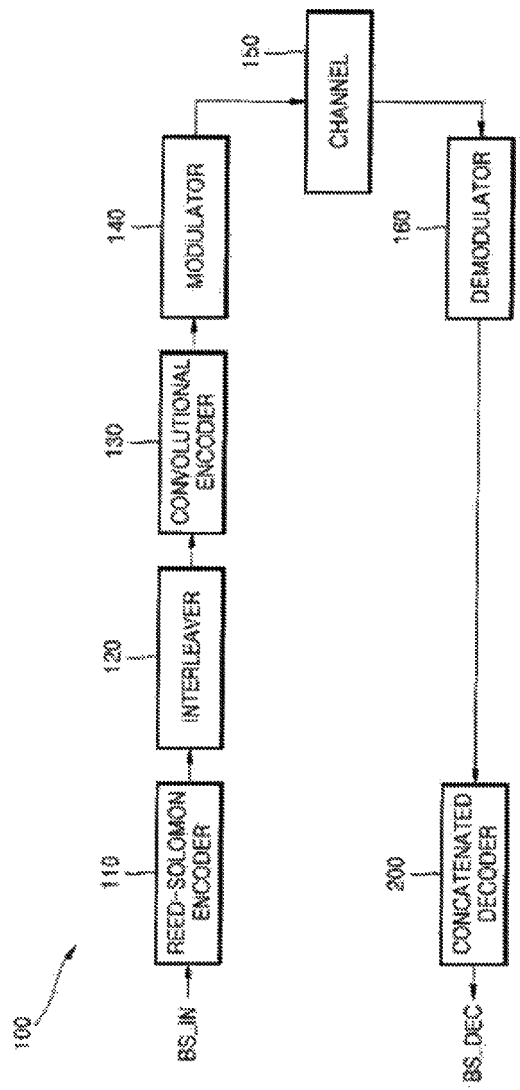
FIG. 1 is a block diagram of a conventional digital communication system which uses concatenated Reed-Solomon codes and convolutional codes.
Figure 2:
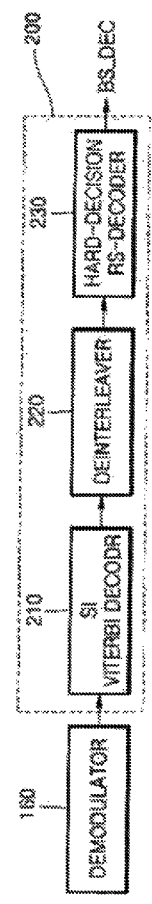
FIG. 2 is a block diagram of the concatenated decoder illustrated in FIG. 1.

Exemplary embodiments of the present invention will be described in detail with reference to the attached drawings. Like reference numerals in the drawings may denote like elements.

A turbo decoder 300 and a concatenated Reed-Solomon and Convolutional (RSC) decoder 400 are described below.

Figure 3:
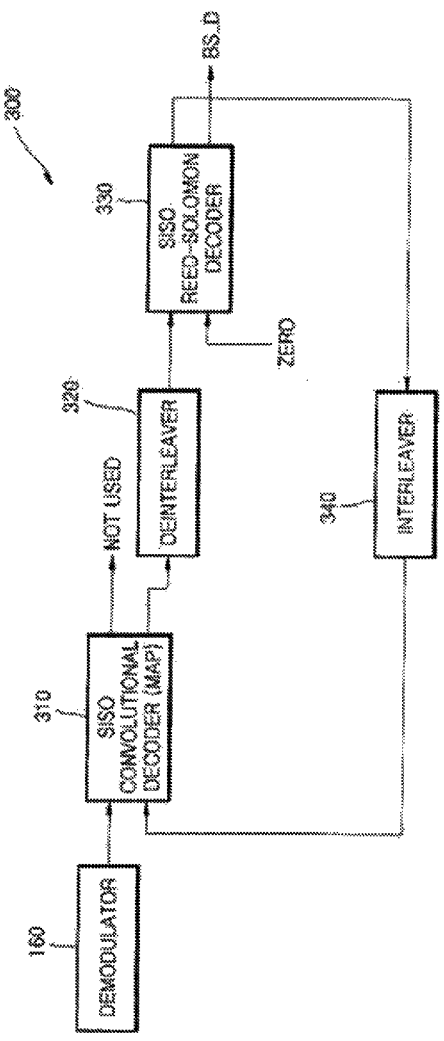
FIG. 3 is a block diagram of a turbo decoder.

FIG. 3 is a block diagram of the turbo decoder 300.

Referring to FIG. 3, the turbo decoder 300 includes a soft-input/soft-output (hereinafter, referred to as "SISO") convolutional decoder 310, a deinterleaver 320, a SISO Reed-Solomon decoder 330, and an interleaver 340

As illustrated in FIG. 3, the turbo decoder 300 includes two SISO decoders: the SISO convolutional decoder 310 and the SISO Reed-Solomon decoder 330. One of the two SISO decoders 310 and 330 decodes outer codes and the other decodes inner codes. However, the inclusion of the SISO Reed-Solomon decoder 330 increases complexity of the turbo decoder 300.

Figure 4:
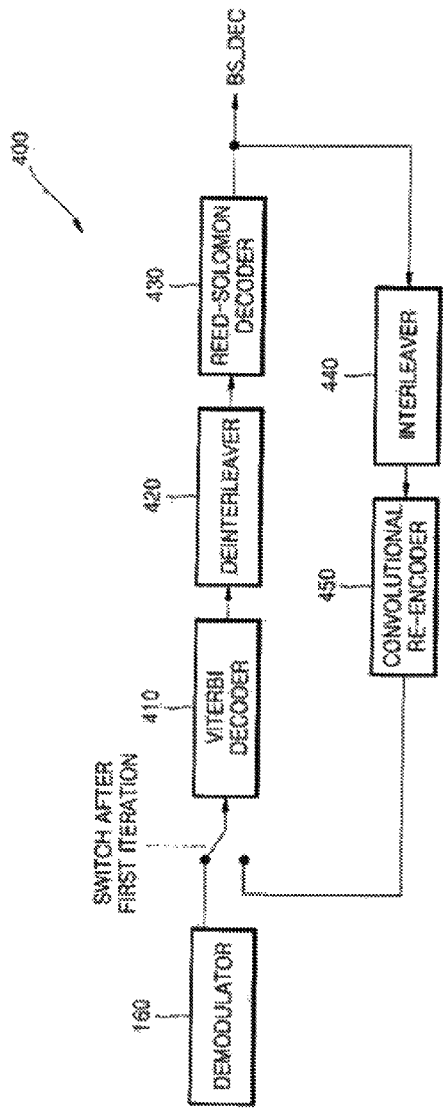
FIG. 4 is a block diagram of a concatenated Reed-Solomon and Convolutional (RSC) decoder.

FIG. 4 is a block diagram of the concatenated RSC decoder 400.

Referring to FIG. 4, the concatenated RSC decoder 400 includes a Viterbi decoder 410, a deinterleaver 420, a Reed-Solomon decoder 430, an interleaver 440, and a convolutional encoder 450. For the convenience of description, a demodulator 160 is illustrated in FIG. 4.

Data received from the demodulator 160 is transferred to the Reed-Solomon decoder 430 via the Viterbi decoder 410 and the deinterleaver 420. The Reed-Solomon decoder 430 performs hard-decision. The convolutional encoder 450 encodes the hard-decision result and feeds back the encoded result to the Viterbi decoder 410. However, the concatenated RSC decoder 400 illustrated in FIG. 4 may allow for the propagation of error.

Figure 5:
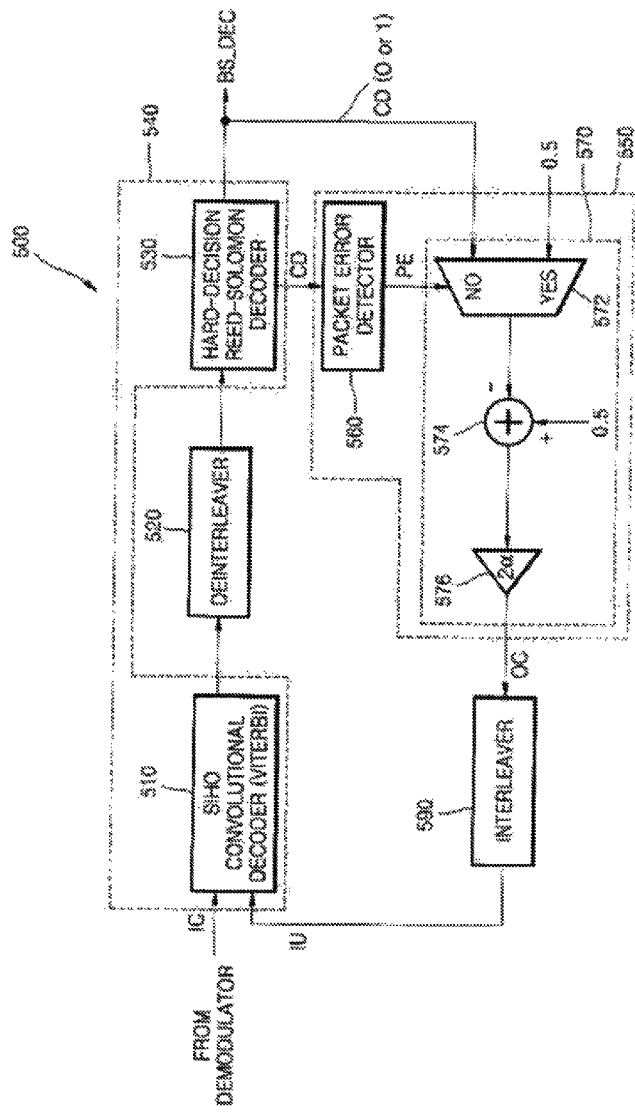
FIG. 5 is a block diagram of a decoding apparatus according to an exemplary embodiment of the present invention.

FIG. 5 is a block diagram of a decoding apparatus 500 according to an exemplary embodiment of the present invention.

Referring to FIG. 5, the decoding apparatus 500 includes a hard-decision unit 540 and a reliability determination unit 550.

The hard-decision unit 540 performs hard-decision on a soft-input of an input code IC and outputs a hard-decision result CD. The input code may be a code received from a demodulator. The reliability determination unit 550 generates a reliability estimation value OC of the hard-decision result CD, according to whether a packet error PE exists in the hard-decision result CD. The hard-decision unit 540 performs the hard-decision in response to the reliability estimation value OC of the hard-decision result CD.

The hard-decision unit 540 may include a hard-decision Reed-Solomon decoder 530. The hard-decision Reed-Solomon decoder 530 performs the hard-decision and outputs the hard-decision result CD to the reliability determination unit 550.

The reliability determination unit 550 can include a packet error detector 560. The packet error detector 560 detects the packet error PE in response to the hard-decision result CD generated by the hard-decision Reed-Solomon decoder 530. The operation of the packet error detector 560 is discussed below.

Again referring to FIG. 5, the reliability determination unit 550 may also include a reliability estimation value generator 570. The reliability estimation value generator 570 generates a reliability estimation value OC of the hard-decision result CD according to whether the packet error PE is detected. When no packet error PE is detected, the reliability estimation value generator 570 can generate a reliability estimation value OC which changes in response to the hard-decision result CD. When the packet error PE is detected, the reliability estimation value generator 570 can generate a reliability estimation value OC having a constant value. When no packet error PE is detected, the reliability estimation generator 570 can generate a reliability estimation value OC having a value of $+\alpha$ when the hard-decision result CD is 1 and can generate a reliability estimation value OC having a value of $-\alpha$ when the hard-decision result CD is 0. When the packet error PE is detected, the reliability estimation value generator 570 can generate a reliability estimation value OC having a value of 0. For example, the reliability estimation value OC of the hard-decision result CD can be calculated by Equation 1.

$$OC=\alpha(1-2*CD), \text{ if no packet-error detected}$$

$$OC=0, \text{ if packet-error detected} \quad (1)$$

The reliability estimation value generator 570 may also include a multiplexer 572. The multiplexer 572 selects either the hard-decision result CD or a predetermined constant value in response to whether the packet error PE is detected. The reliability estimation value generator 570 may also include an adder 574 and an amplifier 576 to provide the reliable estimation value as described above.

The hard-decision unit 540 may also include a soft-input/hard-output decoder 510. The soft-input/hard-output decoder 510 generates a hard-output in response to the soft-input of the input code IC and the reliability estimation value OC. For example, as shown in FIG. 5, the hard-decision Reed-Solomon decoder 530 performs hard-decision on the hard-output generated by the soft-input/hard-output decoder 510. The soft-input/hard-output decoder 510 may be a soft-input/hard-output Viterbi decoder or a soft-input/hard-output convolutional decoder.

The decoding apparatus 500 may also include a deinterleaver 520 and an interleaver 590. The deinterleaver 520 deinterleaves the hard-output of the soft-input/hard-output decoder 510 and outputs the deinterleaved result to the hard-decision Reed-Solomon decoder 530. The interleaver 590 interleaves the reliability estimation value OC of the hard-decision result CD and outputs the interleaved result IU to the soft-input/hard-output decoder 510.

If the soft-input/hard-output decoder 510 is a soft-input/hard-output Viterbi decoder, the soft-input/hard-output Viterbi decoder 510 can use the output value of the interleaver 590 to calculate a branch matrix. For example, the soft-input/hard-output Viterbi decoder 510 can calculate the branch matrix using Equation 2.

$$BM'=BM+Uk*INT(CD), \quad (2)$$

where, BM denotes a conventional branch matrix, BM' denotes a branch matrix according to the present invention, Uk denotes a bit corresponding a branch of the branch matrix, among the bits of the hard-decision result value CD, and INT(CD) denotes the output value of the interleaver 590.

The input code IC may be a concatenated code.

Hereinafter, the operation of the packet error detector 560 will be described with reference to FIGS. 6 and 7.

Figure 6:
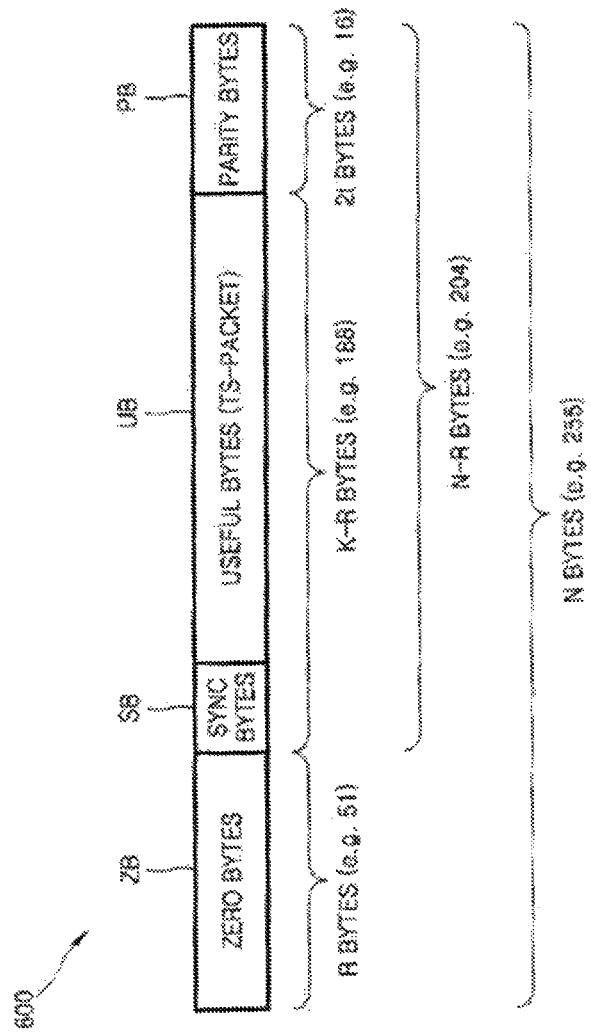
FIG. 6 illustrates a structure of a Reed-Solomon code.

FIG. 6 illustrates the structure of a Reed-Solomon code 600.

Referring to FIG. 6, it is assumed that the entire length of the Reed-Solomon code 600 is N bytes (for example, 255 bytes). The upper R bytes (RB; for example, 255 bytes) of the Reed-Solomon code 600 can be all zero. The Reed-Solomon code 600 includes a long Reed-Solomon code type and a short Reed-Solomon code type. Here, the upper R bytes of a short Reed-Solomon code may all be zero, and the upper R bytes of a long Reed-Solomon code may be non-zero. The Reed-Solomon code 600 can include sync bytes SB for synchronization. In the Reed-Solomon code 600, actual data is includes in a data area UB. The data area UB and the sync bytes SB may be K-R bytes (for example, 188 bytes). The Reed-Solomon code 600 can include parity bits PB. The parity bits PB may be 2t bytes (for example, t=8 or 16). Here, t denotes the number of bytes that can be corrected by the parity bits PB.

The number of bytes that the Reed-Solomon code 600 can correct using the parity bits PB is limited. However, the Reed-Solomon code 600 can detect uncorrected error bytes.

Figure 7:
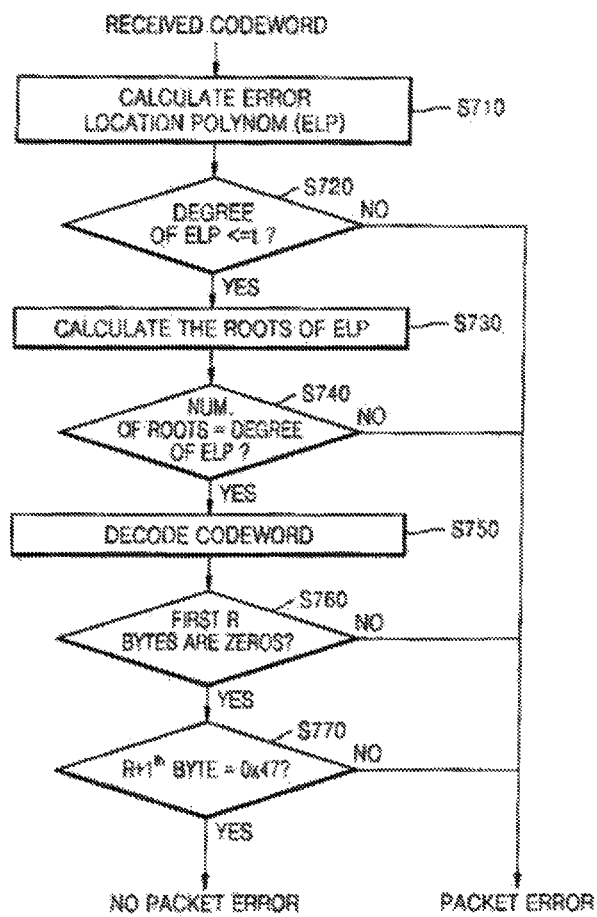
FIG. 7 is a flowchart illustrating the operation of the packet error detector illustrated in FIG. 5.

FIG. 7 is a flowchart illustrating the operation of the packet error detector 560 illustrated in FIG. 5.

The packet error detector 560 detects a packet error PE using a Reed-Solomon code (CD) 600 outputted by the hard-decision Reed-Solomon decoder 530. Referring to FIG. 7, the packet error detector 560 obtains an error location polynomial calculated by the Reed-Solomon code 600 (Step S710). If the degree of the obtained error location polynomial is greater than t (No, Step S720), it is determined that a packet error exists. The number of roots of the error location polynomial is calculated (Step S730). If the number of roots of the error location polynomial is different from the degree of the error location polynomial (No, Step S740), it is determined that a packet error exists. The Reed-Solomon codeword received from the hard-decision Reed-Solomon decoder is decoded (Step S750). If a byte which is not zero is included in the upper R bytes RB of the Reed-Solomon code 600 (No, Step S760, it is determined that a packet error exists. If the sync byte SB of the Reed-Solomon code 600 does not have a specific value, for example, 0x47 (No, Step S770), it is determined that a packet error exists. However, if the degree of the obtained error location polynomial is less than or equal to t (Yes, Step S720), the number of roots of the error location polynomial is the same as the degree of the error location polynomial (Yes, Step S740), a byte which is zero is included in the upper R bytes RB of the Reed-Solomon code 600 (Yes, S760), and the sync byte SB of the Reed-Solomon code 600 has the specific value (Yes, S770) then it is determined that no packet error exists.

A probability of detecting a packet error using the Reed-Solomon code 600 is represented by Equation 3.

$$P_e = q^{K-N} \sum_{m=0}^{t} \binom{N}{m}(q-1)^m \quad (3)$$

For example, if the data area UB and sync byte SB of the Reed-Solomon code 600 is 188 bytes and the parity bits PB are 16 bytes, $P_e$ becomes $3.4*10^{-6}$ in Equation 3.

Figure 8:
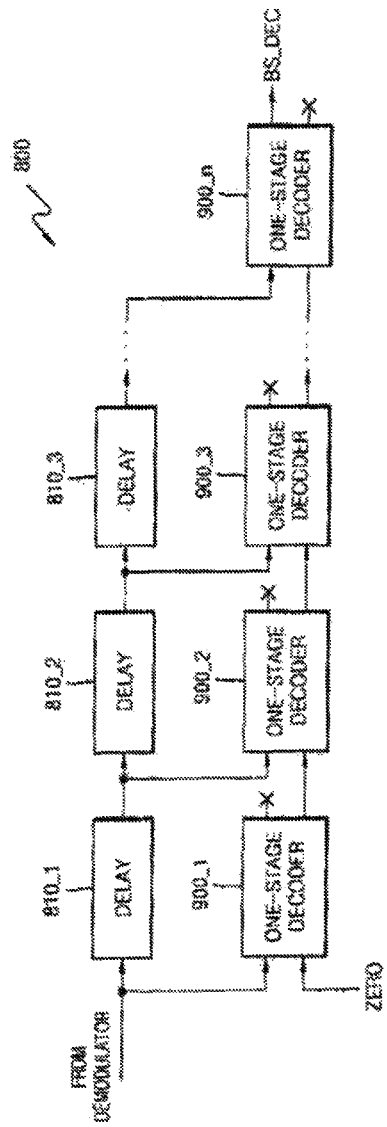
FIG. 8 is a block diagram of a decoding system according to an exemplary embodiment of the present invention.

FIG. 8 is a block diagram of a decoding system 800 according to an exemplary embodiment of the present invention.

Figure 9:
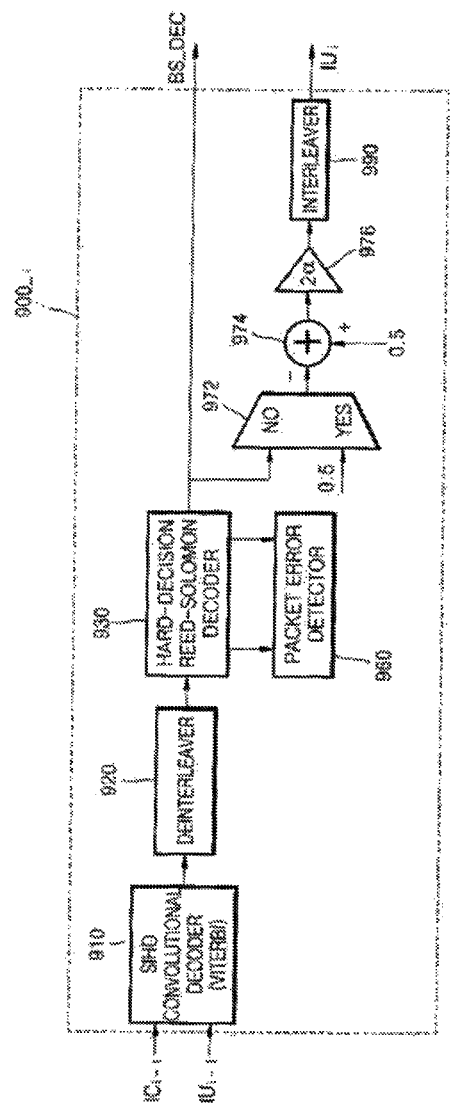
FIG. 9 is a block diagram of the decoder illustrated in FIG. 8.

FIG. 9 is a block diagram of the decoder 900_$i$ illustrated in FIG. 8.

Referring to FIG. 8, the decoding system 800 includes first through N-th (N is a natural number) decoders 900_1, 900_2, 900_3, . . . , 900n, and first through (N−1)-th delay units 810_1, 800_2, 810_3, . . . , 800_N−1 (not shown). The first through N-th decoders 900_1 through 900_n and the first through (N−1)-th delay units 810_1 through 810_(N−1) are respectively connected in series with each other.

Referring to FIG. 9, the decoder 900_$i$ has a structure that is similar to the structure of the decoder 500 illustrated in FIG. 5. For example, the decoder 900_$i$ includes a soft-input/hard-output decoder 910, a deinterleaver 920, a hard-decision Reed-Solomon decoder 930, a packet error detector 960, a multiplexer 972, an adder 974, an amplifier 976, and an interleaver 990, each corresponding to an item of FIG. 5 above. Therefore, many details concerning the decoder 900_$i$ and the constituent items may be understood by the discussion above pertaining to the decoder of FIG. 5. In the decoder 900_$i$, the output of a reliability determination unit (not shown) is not fed back to a soft-input/hard-output decoder (not shown). The output of the reliability determination unit of the decoder 900_$i$ is transferred to a hard-decision unit of a decoder 900_$i$+1. The decoder 900_$i$+1 performs hard-decision on a delayed soft-input in response to a reliability estimation value of a hard-decision result outputted from the decoder 900_$i$.

A decoding method according to an exemplary embodiment of the present invention includes hard-decision operations and reliability determination operation. In the hard-decision operation, hard-decision is performed on a soft-input of a code. In the reliability determination operation, a reliability estimation value of the hard-decision result is generated according to whether a packet error exists in the hard-decision result. In the hard-decision operation, the hard-decision is performed in response to the reliability estimation value.

The hard-decision operation may include a hard-decision Reed-Solomon decoding operation. In the hard-decision Reed-Solomon decoding operation, the hard-decision is performed and the hard-decision result is outputted to the reliability determination operation. The reliability determination operation can include a packet error detection operation. In the packet error detection operation, the packet error is detected in response to the hard-decision result obtained by the hard-decision Reed-Solomon decoding operation. The reliability determination operation may also include a reliability estimation value generating operation. In the reliability estimation value generating operation, a reliability estimation value of the hard-decision result is generated according to whether the packet error is detected.

The decoding method according to an exemplary embodiment of the present invention has a similar technical concept as the decoding apparatus 500 described above with respect to FIG. 5. The structure of the decoding apparatus 900_$i$ corresponds to the structure of the decoding apparatus 500. Therefore, the decoding method according to an exemplary embodiment of the present invention can be understood by those skilled in the art from the above descriptions.

Figure 10:
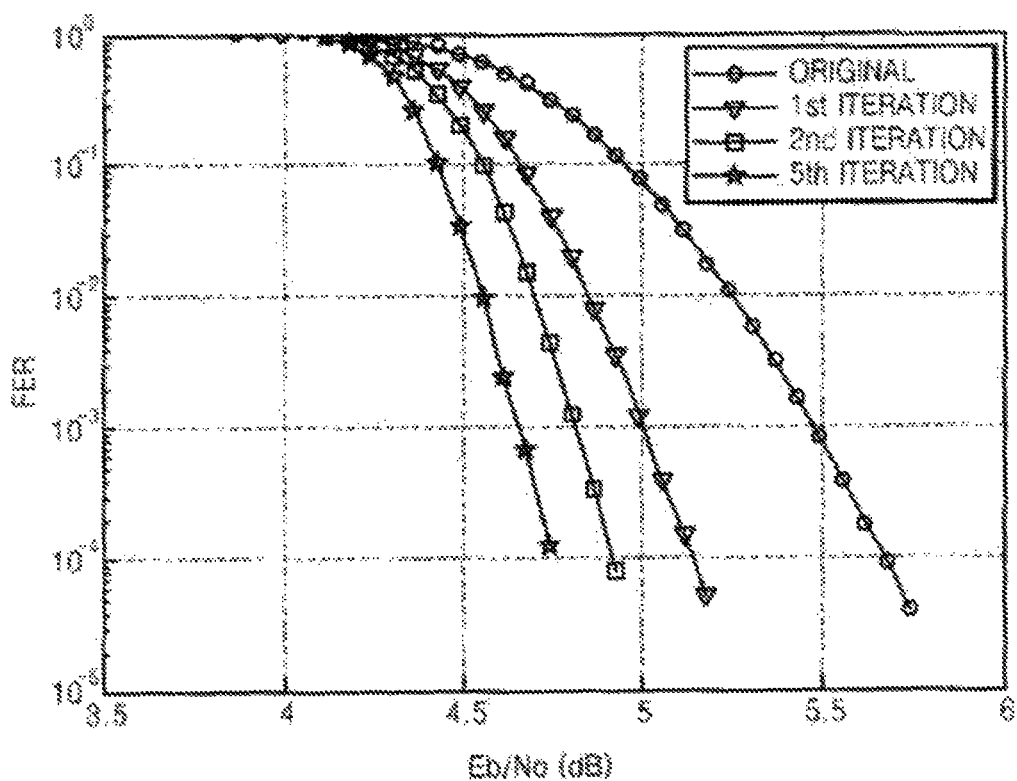
FIG. 10 is a graph showing simulation results of the operation of the decoding apparatus according to an exemplary embodiment of the present invention.

FIG. 10 is a graph showing simulation results of the operation of the decoding apparatus 500 according to an exemplary embodiment of present invention.

Referring to FIG. 10, when the decoding apparatus 500 operates, a frame error rate (FER) is lowered, and accordingly, gain characteristics are enhanced.

As described above, in a decoding apparatus and method according to the present invention, a frame error rate (FER) may be lowered when decoding and thus enhance gain characteristic.

While exemplary embodiments of the present invention have been particularly shown and described with reference to the drawings, it will be understood by those of ordinary skill in the art that various changes in form and details may be made therein without departing from the spirit and scope of the present invention.

What is claimed is:

1. A decoding apparatus comprising:
   a hard-decision unit performing hard-decision on a soft-input of a code;
   a reliability determination unit generating a reliability estimation value of a result of the hard-decision,
   wherein the reliability estimation value depends on whether a packet error exists or does not exist in the hard-decision result,
   wherein the hard-decision unit performs hard-decision depending on the reliability estimation value,
   wherein the reliability determination unit generates the reliability estimation value, which changes depending on the hard-decision result, when the packet error does not exist in the hard-decision result, and the reliability determination unit generates a constant reliability estimation value when the packet error exists in the hard-decision result,
   wherein the reliability determination unit comprises a packet error detector for detecting the packet error, depending on the hard-decision result outputted from the hard-decision unit,
   wherein the reliability determination unit further comprises a reliability estimation value generator for generating the reliability estimation value of the hard-decision result, according to whether the packet error is detected, and
   wherein the reliability estimation value generator further comprises a multiplexer for selecting either the hard-decision result value or a predetermined constant value, depending on whether the packet error is detected.

2. The decoding apparatus of claim 1, wherein the reliability estimation value is fed back to the hard-decision unit.

3. The decoding apparatus of claim 1, wherein the hard-decision unit comprises a hard-decision Reed-Solomon decoder for performing the hard-decision and outputting the hard-decision result to the reliability determination unit.

4. The decoding apparatus of claim 3, wherein the hard-decision unit further comprises a soft-input/hard-output decoder for generating a hard-output, depending on the soft-input of the code and the reliability estimation value, and
   the hard-decision Reed-Solomon decoder performs the hard-decision on the hard-output generated by the soft-input/hard-output decoder.

5. The decoding apparatus of claim 4, wherein the soft-input/hard-output decoder is a soft-input/hard-output Viterbi decoder or a soft-input/hard-output convolutional decoder.

6. The decoding apparatus of claim 5, further comprising:
   a deinterleaver deinterleaving the hard-output of the soft-input/hard-output decoder and outputting a deinterleaved result to the hard-decision Reed-Solomon decoder; and
   an interleaver interleaving the reliability estimation value of the reliability determination unit and outputting the interleaved result to the soft-input/hard-output decoder.

7. The decoding apparatus of claim 6, wherein the soft-input/hard-output Viterbi decoder uses an output value of the interleaver to calculate a branch matrix.

8. The decoding apparatus of claim 1, wherein the reliability estimation value generator generates the reliability estimation value, which changes depending on the hard-decision result, when no packet error is detected, and the reliability estimation value generator generates a constant reliability estimation value when the packet error is detected.

9. The decoding apparatus of claim 8, wherein, when no packet error is detected, the reliability estimation value generator generates a reliability estimation value having a value of +α, when the hard-decision result is 1, and generates a reliability estimation value of −α, when the hard-decision result is 0.

10. The decoding apparatus of claim 8, wherein, when the packet error is detected, the reliability estimation value generator generates a reliability estimation value of 0.

11. The decoding apparatus of claim 1, wherein the code is a concatenated code.

12. A decoding system comprising:
    a plurality of decoding apparatuses, each being a decoding apparatus according to claim 1, connected in series;
    a plurality of delay units connected in series for sequentially delaying the soft-input, there being one less delay unit than decoding apparatus and all but a first decoding apparatus having a corresponding delay unit;
    wherein each of the plurality of delaying units sequentially delays the soft-input and applies the delayed soft-input to the corresponding decoding apparatus; and
    each decoding apparatus except the first decoding apparatus performs hard-decision on the received delayed soft-input in response to a reliability estimation value of a hard-decision result output from its immediately previous decoding apparatus.

13. The decoding apparatus of claim 1, wherein the reliability estimation value is either a value based on a hard-decision result value or a predetermined constant value, depending on whether the packet error exists in the hard-decision result.

14. A decoding method comprising:
    performing hard-decision on a soft-input of a code; and
    generating a reliability estimation value of a result of the hard-decision, wherein the reliability estimation value depends on whether a packet error exists or does not exist in the hard-decision result,
    wherein the hard-decision is performed depending on the reliability estimation value, and
    wherein the reliability estimation value, which changes depending on the hard-decision result, is generated when the packet error does not exist in the hard-decision result, and a constant reliability estimation value is generated when the packet error exists in the hard-decision result,
    wherein generating the reliability estimation value comprises detecting the packet error depending on the hard-decision result,
    wherein generating the reliability estimation value further comprises generating a reliability estimation value of the hard-decision result depending on whether the packet error is detected, and
    wherein the reliability determination operation further comprises selecting either the hard-decision result value or a predetermined constant value, depending on whether the packet error is detected.

15. The decoding method of claim 14, wherein performing the hard-decision further comprises performing hard-decision Reed-Solomon decoding.

16. The decoding method of claim 15, wherein the hard-decision operation further comprises generating a hard-output depending on the soft-input of the code and the reliability estimation value, and wherein, in the hard-decision Reed-Solomon decoding operation, the hard-decision is performed on the hard-output generated by a soft-input/hard-output decoding operation.

17. The decoding method of claim 16, wherein, in the soft-input/hard-output decoding operation, soft-input/hard-output Viterbi decoding is performed.

18. The decoding method of claim 14, wherein, in the generating of the reliability estimation value,
   a reliability estimation value, which changes depending on the hard-decision result, is generated when no packet error is detected, and
   a constant reliability estimation value is generated when the packet error is detected.

19. The decoding method of claim 18, wherein, in the generating of the reliability estimation value,
   when no packet error is detected, a reliability estimation value of $+\alpha$ is generated when the hard-decision result is 1, and a reliability estimation value of $-\alpha$ is generated when the hard-decision result is 0.

20. The decoding method of claim 18, wherein, in the generating of the reliability estimation value, when the packet error is detected, a reliability estimation value of 0 is generated.

21. The decoding method of claim 14, wherein the reliability estimation value is either a value based on a hard-decision result value or a predetermined constant value, depending on whether the packet error exists in the hard-decision result.

* * * * *